United States Patent [19]

Battersby

[11] Patent Number: 5,254,863
[45] Date of Patent: Oct. 19, 1993

[54] SEMICONDUCTOR DEVICE SUCH AS A HIGH ELECTRON MOBILITY TRANSISTOR

[75] Inventor: Stephen J. Battersby, Haywards Heath, England

[73] Assignee: U.S. Philips Corp., New York, N.Y.

[21] Appl. No.: 776,107

[22] Filed: Oct. 15, 1991

[30] Foreign Application Priority Data

Oct. 19, 1990 [GB] United Kingdom ............... 9022756

[51] Int. Cl.$^5$ ............................................. H01L 29/80
[52] U.S. Cl. ................................. 257/191; 257/192; 257/194; 257/287; 257/280
[58] Field of Search ............ 357/16, 4, 22 A, 22 MD, 357/90, 22 I, 22 K, 23.2; 257/191, 192, 194, 195, 287, 285, 280, 187

[56] References Cited

U.S. PATENT DOCUMENTS

| | | | |
|---|---|---|---|
| 4,194,935 | 3/1980 | Dingle et al. | 357/22 A X |
| 5,038,187 | 8/1991 | Zhou | 357/22 A |
| 5,049,951 | 9/1991 | Goronkin et al. | 357/22 A X |
| 5,099,295 | 3/1992 | Ogawa | 357/22 A |

FOREIGN PATENT DOCUMENTS

| | | | |
|---|---|---|---|
| 58-143572 | 8/1983 | Japan | 357/22 MD |
| 59-63769 | 4/1984 | Japan | 357/22 MD |
| 0063170 | 1/1988 | Japan | 357/22 A |
| 63-197379 | 8/1988 | Japan | 357/22 A |
| 1-31470 | 2/1989 | Japan | 357/22 A |
| 2-231733 | 9/1990 | Japan | 357/22 A |

Primary Examiner—William Mintel
Attorney, Agent, or Firm—Steven R. Biren

[57] ABSTRACT

A semiconductor device is formed by a semiconductor body (1) having a substrate (2) on which is provided a channel-defining region (10) extending between input and output regions (20) and (21). The channel-defining region (10) has a channel layer (11) forming a heterojunction (12) with at least one barrier layer (13) to form within the channel layer (11) a two-dimensional free charge carrier gas (14) of one conductivity type for providing a conduction channel (14) controllable by a gate electrode (25). A potential well region (30) is provided between the substrate (2) and the channel-defining region (10). The potential well region (30) has at least one potential well-defining layer (31) forming heterojunctions (32) with adjacent barrier layers (33) to define a potential well which is empty of free charge carriers of the one conductivity type when no voltage is applied between the input and output regions (20 and 21) and which is sufficiently deep and wide to trap hot charge carriers of the one conductivity type which are emitted from the channel-defining region (10) towards the substrate (1) when a high lateral electrical field exists in the channel-defining region (10), thereby constraining the hot charge carriers near to the gate electrode and enabling an improved output impedance when the device is an FET.

11 Claims, 2 Drawing Sheets

SEMICONDUCTOR DEVICE SUCH AS A HIGH ELECTRON MOBILITY TRANSISTOR

BACKGROUND OF THE INVENTION

Semiconductor devices are known, for example as described in EP-A-243953, which comprise a semiconductor body having a substrate on which is provided a channel-defining region extending between input and output regions, generally source and drain regions, the channel-defining region comprising a channel layer forming a heterojection with at least one barrier layer so as to form within the channel layer a two-dimensional free charge carrier gas of one conductivity type for providing between the input and output regions a conduction channel controllable by a gate electrode overlying the channel-defining region.

EP-A-243953 is concerned with a semiconductor device such as an FET or HEMT in which the channel-defining region is constructed so as to reduce the variation of electron mobility with the strength of the lateral electric field existing in the channel-defining region. In particular, the channel-defining region is formed by a series of alternate thin layers of two different materials one of which is of larger band gap and so defines barrier layers forming heterojunctions with the other layers which provide, under low electric fields, channels layers in which a two dimensional electron gas is provided. The two materials are selected such that the electron mobility in the one material (normally the barrier-defining material) is lower than the electron mobility in the other material under low applied electric fields but is higher under high electric fields. Thus, conduction occurs preferentially in the channel layers defined by the other material under low electric fields and in the barrier layers defined by the one material under high electric fields. Accordingly the dependency of electron mobility on electric field can be reduced. However, other problems arise when such semiconductor devices are subjected to high electric fields. In particular, the existence of a high lateral electric field in the channel-defining region tends to cause hot charge carriers (that is charge carriers which are not in thermal equilibrium with the crystal lattice) to be emitted from the channel-defining region towards the substrate. The ejection of such hot charge carriers into the substrate is the main origin of the finite output impedance characteristics of FETs and HEMTs.

SUMMARY OF THE INVENTION

It is an aim of the present invention to provide a semiconductor device in which the ejection under high applied electric fields of hot charge carriers from the channel-defining region into the substrate is inhibited or at least reduced.

According to the present invention, there is provided a semiconductor device comprising a semiconductor body having a substrate on which is provided a channel-defining region extending between input and output regions, the channel-defining region comprising a channel layer forming a heterojunction with at least one barrier layer so as to form within the channel layer a two-dimensional free charge carrier gas of one conductivity type for providing between the input and output regions a conduction channel controllable by a gate electrode overlying the channel-defining region, characterized in that a potential well region is provided between the substrate and the channel-defining region which comprises at least one potential well-defining layer forming heterjunctions with adjacent barrier layers to define for charge carriers of the one conductivity type a potential well which is empty of free charge carriers of the one conductivity type when no voltage is applied between the input and output regions and which is sufficiently deep and wide to trap hot charge carriers of the one conductivity emitted from the channel-defining region towards the substrate when a high lateral electric field exists in the channel-defining region.

It should be understood that, as used herein, the term 'lateral electric field' refers to an electric field along the plane of the layers forming the channel-defining region.

Thus, in a semiconductor device in accordance with the invention, the potential well region provides at least one potential well between the channel-defining region and the substrate which is empty of free charge carriers when no voltage is applied between the input and output regions but which is sufficiently deep and wide to trap hot charge carriers of the one conductivity type emitted from the channel-defining region in the potential well where the trapped charge carriers thermalize, that is come into thermal equilibrium with the lattice. Accordingly, the hot charge carriers are constrained or trapped nearer to the gate electrode and are inhibited from being emitted into the substrate, so enabling a higher output impedance to be achieved, which is of particular importance where the semiconductor device is, for example, a FET designed for microwave applications.

The potential well may, where for example the potential well is provided by a gallium arsenide layer and the barrier layers are formed of aluminum gallium arsenide, have a depth in energy of approximately 0.2 ev (electron volts). It should be appreciated that the potential well should be as deep as possible although for the gallium arsenide/aluminum gallium arsenide system the maximum depth will be in the region of 0.25 ev. Strained layer systems could be used to increase the depth of the potential well. Generally, the width of the potential well should not be so small that the energy levels lie too near to the top of the potential well as this would make capture and retention of electrons by the potential well difficult. On the other hand, the width of the potential well, in combination with the spacing of the potential well from the channel-defining region, should not be too large as this would adversely affect the characteristics, for example the output impedance, of the device. Generally speaking the maximum combined width of the potential well and the spacing of the potential well from the channel defining region should be less than $L_g/3$ where $L_g$ is the length of the gate and may typically be 0.5 $\mu$m (micrometers). The combined width of the potential well and the spacing of the potential well from the channel-defining region should be less than 200 nm, while the width of the potential well should be at least 10 nm. To take an example, the potential well may be 30 nm wide and may be spaced from the channel layer or the adjacent channel layer of the channel-defining region by a distance of approximately 50 nm.

The potential well region may comprise a number of potential well-defining layers forming heterojunctions with adjacent barrier layers and the barrier layers may be sufficiently wide that adjacent potential wells are not electronically coupled. The provision of a number of potential wells in the potential well region should increase the probability of trapping or capture of hot charge carriers emitted from the channel-defining region.

The channel layer may be bounded on either side by heterojunction-defining barrier layers thereby forming a potential well, normally a quantum well, for charge carriers of the one conductivity type which should provide better carrier confinement and thus enable HEMTs of reduced output conductance to be manufactured. The channel-defining region may comprise a number of parallel quantum wells defining a number of parallel conduction channels, so increasing the current-carrying capability of the device. The barrier layers of the channel-defining region may be sufficiently thin that the potential wells are electronically coupled to form a superlattice region.

At least one barrier layer forming a heterojunction with the at least one channel layer may be doped with impurities for providing the free charge carriers of the one conductivity type within the channel layer by so-called modulation doping thereby separating the dopant impurities from the channel layer, reducing scattering possibilities and so providing increased mobility within the channel layer. Such a barrier layer may have an undoped spacer region spacing the doped region from the channel layer so as to separate the dopant impurities even further from the channel layer.

Where the conduction channel region comprises a number of channel layers each forming a potential well for charge carriers of the one conductivity type by defining a first heterojunction with the barrier layer on which the conduction channel layer is formed and a second heterojunction with the barrier layer formed on the channel layer, a first subsidiary barrier layer doped with impurities characteristic of the one conductivity type may be provided adjacent each second heterojunction for providing free charge carriers of the one conductivity type in the channel layers at the second heterojunctions and a second subsidiary barrier layer doped with impurities characteristic of the opposite conductivity type and sufficiently thin and lightly doped as to be fully depleted of free charge carriers at zero bias may be provided between channel layers adjacent the first heterojunction for inhibiting the provision of free charge carriers of the one conductivity type in a channel layer at the first heterojunction.

The barrier layers of the potential well-defining region may be graded so as to produce graded heterojunction interfaces thereby defining a shallow subsidiary potential well surrounding the potential well(s) of the potential well-defining region. This should facilitate capture of electrons because the subsidiary potential well will initially trap and confine the electrons to increase the probability of the electrons being captured by the potential well.

Each first subsidiary barrier layer may be spaced from the associated second heterojunction by an undoped spacer subsidiary layer of the barrier layer.

A buffer layer, for example an undoped superlattice structure, may be provided between the substrate and the potential well-defining region so as to improve the morphology of the subsequent structure which is then grown on the buffer layer using conventional techniques such as molecular beam epitaxy (MBE).

BRIEF DESCRIPTION OF THE DRAWING

Embodiments of the invention will now be described, by way of example, with reference to the accompanying drawing, in which.

Figure 1:
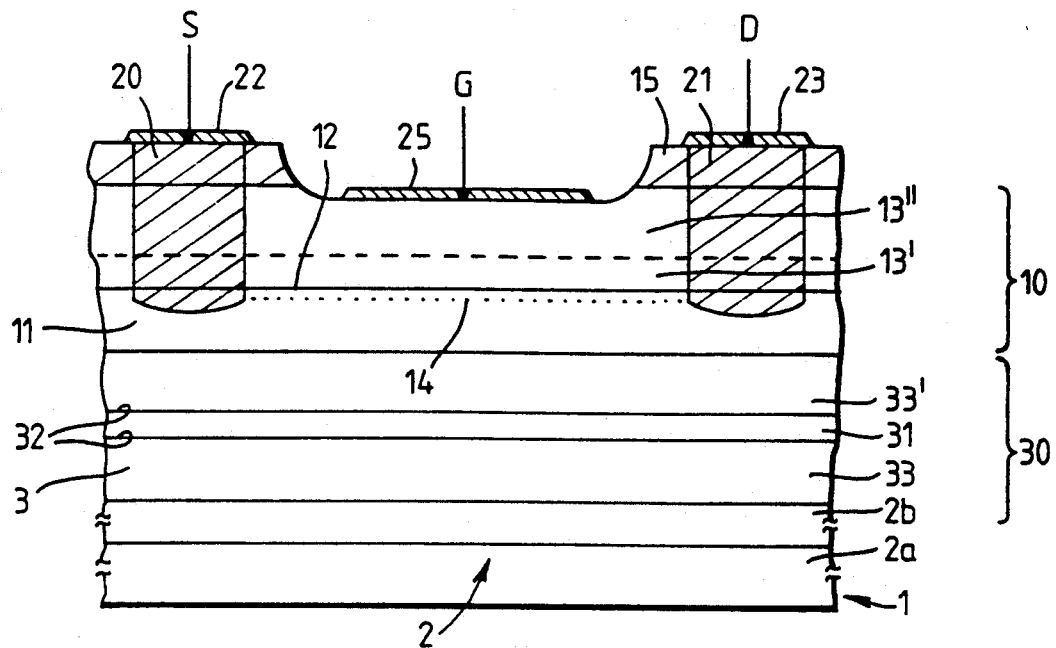
FIG. 1 is a cross-sectional view of a first embodiment of a high electron mobility transistor in accordance with the invention.
Figure 3:
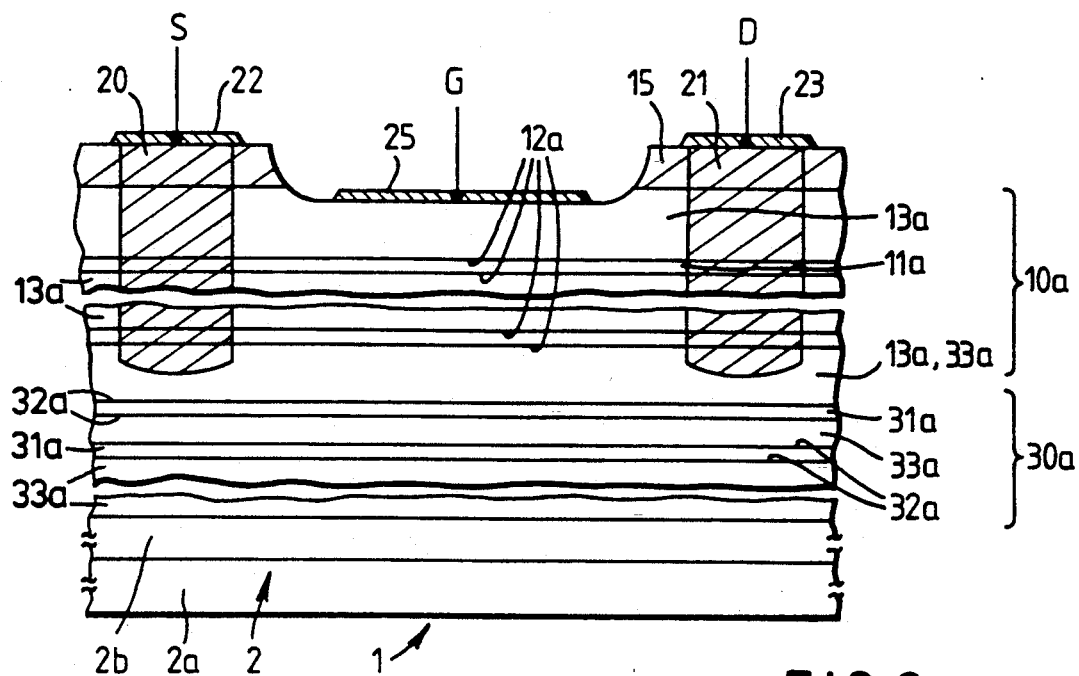
FIG. 3 is a cross-sectional view, partially broken-away, of a second embodiment of a high electron mobility transistor (HEMT) in accordance with the invention.
Figure 4:
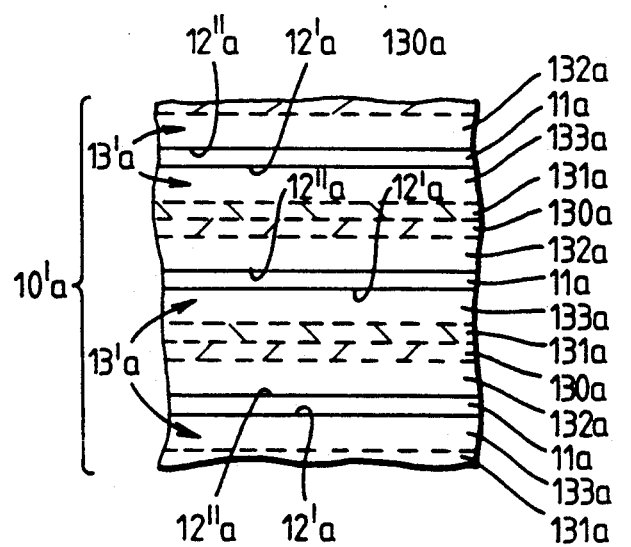
FIG. 4 is a cross-sectional view showing in greater detail one possible form for a channel-defining region of the device shown in FIG. 3.

It should be noted that FIGS. 1, 3 and 4 of the drawings are not to scale and that various dimensions and proportions, especially in the direction of thickness of layers in FIGS. 1, 3 and 4, may have been relatively exaggerated or reduced in the interests of convenience and clarity. Furthermore certain areas, such as areas which are not-intentionally doped, hereinafter referred as undoped, have in the interests of clarity not been cross-hatched in FIGS. 1, 3 and 4.

DESCRIPTION OF THE PREFERRED EMBODIMENTS

Referring now to the drawings, for example FIG. 1 or FIG. 3, there is illustrated a semiconductor device comprising a semiconductor body 1 having a substrate 2 on which is provided a channel-defining region 10 extending between input and output regions 20 and 21, the channel-defining region 10 comprising a channel layer 11 forming a heterojunction 12 with at least one barrier layer 13' so as to form within the channel layer 11 a two-dimensional free charge carrier gas 14 (indicated by the dotted line in FIG. 1) of one conductivity type for providing between the input and output regions 20 and 21 a conduction channel 14 controllable by a gate electrode 25 overlying the channel-defining region 10.

Figure 2:
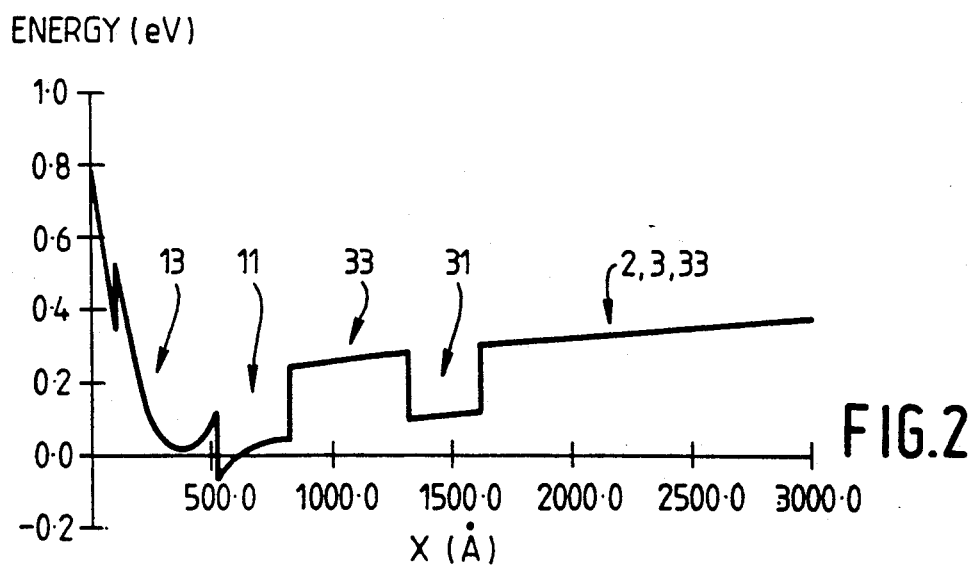
FIG. 2 is a conduction band energy diagram for the device shown in FIG. 1 with zero voltage applied between input and output regions of the device.

In accordance with the invention, a potential well region 30 is provided between the substrate 2 and the channel-defining region 10 which comprises at least one potential well-defining layer 31 forming heterojunctions 32 with adjacent barrier layers 33 and 33' to define for charge carriers of the one conductivity type a potential well 31 which, as illustrated graphically in FIG. 2, is empty of free charge carriers of the one conductivity type when no voltage is applied between the input and output regions 20 and 21 and which is sufficiently deep and wide to trap hot charge carriers of the one conductivity type which are emitted from the channel-defining region 10 towards the substrate 1 when a high lateral (that is along the planes of the layers forming the channel-defining region) electric field exists in the channel-defining region 10.

The potential well region 30 thus provides at least one potential well which is empty of free charge carriers of the one conductivity type when no voltage is applied between the input and output regions 20 and 21. However, under high electric fields hot charge carriers emitted from the channel-defining region 10 are trapped by the potential well where the hot charge carriers thermalize that is come into equilibrium with the lattice. Thus, the hot charge carriers are constrained or trapped in the potential well 31 and near to the gate electrode 25 and are thus inhibited from being emitted into the substrate 1, so enabling a higher output impedance to be achieved which may be of particular importance where the semiconductor device is, for example, a FET (field effect transistor) or HEMT for use in microwave applications.

Referring now to the specific example of a high electron mobility transistor (HEMT) shown in FIG. 1, the substrate 2 may comprise a semi-insulating monocrystalline gallium arsenide wafer 2a onto which a layer 2b of gallium arsenide is grown by a conventional epitaxial method, for example molecular beam epitaxy (MBE). In this example the wafer 2a and epitaxial layer 2b together form the substrate 2. The remainder of the device structure is grown on the epitaxial layer 2b using a suitable epitaxial techniques, for example MBE.

As shown in FIG. 1, a buffer layer 3 may be provided on the epitaxial layer 2. In this example, the buffer layer is in the form of an undoped superlattice of, for example, gallium arsenide and aluminum arsenide layers selected to have a composition equivalent to an $Al_x Ga_{1-x}As$ alloy where $x=0.25$. Where such a buffer layer 3 is provided then the buffer layer 3 and epitaxial layer 2b may each be about 0.5 µm micrometers thick. If the superlattice buffer layer 3 is omitted then the epitaxial layer 2b may have a thickness of about 1 µm.

The potential well region 30 is then provided. In this example, the potential well region 30 is in the form of a single potential well formed by a potential well-defining layer 31 of gallium arsenide bounded by barriers layers 33 each forming a heterojunction 32 with the potential well-defining layer 31 and, in this example, being formed of aluminum gallium arsenide typically with a composition $Al_{0.25}Ga_{0.75}As$. The layers 31 and 33 are undoped. The barrier layers 33 could be replaced by aluminum arsenide-gallium arsenide superlattices with an average composition equivalent to the alloy $Al_{0.25}Ga_{0.75}As$. Where the superlattice buffer layer 3 is provided this may form the lowermost barrier layer 33 as shown in FIG. 1. If, however, the superlattice buffer layer 3 is omitted and there is only one potential well in the region 30, then a barrier layer, for example of aluminum gallium arsenide, should of course be provided between the epitaxial layer 3 and the potential well to provide one of the two heterojunctions bounding the potential well 31.

The potential well defined by the layer 31 should be sufficiently deep and sufficiently wide so as to be empty of free electrons when no voltage is applied between the input and output regions (in this example the source and drain regions) 20 and 21 of the device and so as to be capable of trapping hot electrons emitted from the channel-defining region 10 when high lateral electric fields exist in the channel-defining region 10. It should be appreciated that the potential well should be as deep as possible although for the gallium arsenide/aluminum gallium arsenide system the maximum depth will be in the region of 0.25 eV. Strained layer systems could be used to increase the depth of the potential well. Generally, the width of the potential well should not be so small that the energy levels lie too near to the top of the potential well as this would make capture and retention of electrons by the potential well difficult. On the other hand, the width of the potential well, in combination with the spacing of the potential well from the channel-defining region, should not be too large as this would adversely affect the characteristics, for example the output impedance, of the device. Generally speaking the maximum combined width of the potential well and the spacing of the potential well from the channel defining region should be less than Lg/3, where Lg is the length of the gate and may typically be 0.5 µm (micrometers). The combined width of the potential well and the spacing of the potential well from the channel-defining region should be less than 200 nm, while the width of the potential well should be at least 10 nm.

In this example, as illustrated graphically in FIG. 2, which shows the conduction band energy in electron volts (eV) across the device with zero volts applied between the source and drain regions 22 and 23, the potential well-defining layer 31 has a width or thickness of about 30 nm (nanometers) and a depth in energy of about 0.2 ev (electron volts). The potential well layer 31 should be sufficiently spaced from the channel-defining region 10 to avoid any significant electronic coupling with the channel-defining region 10 and typically, in this example, the upper aluminum gallium arsenide barrier layer 33' has a thickness of about 50 nm.

In the example illustrated in FIG. 1, the channel-defining region 10 provides a single heterojunction 12 between a gallium arsenide channel layer 11 and an aluminum gallium arsenide barrier layer 13. The gallium arsenide channel layer 11 is undoped and typically of about 30 nm thickness whilst the aluminum gallium arsenide barrier layer 13 is doped with impurities of the one conductivity type to provide, by so-called modulation doping, a two dimensional electron gas 14 (indicated by the dotted line in FIG. 1) within the channel layer 11 adjacent the heterojunction 12 as illustrated graphically in FIG. 2. In this example, the aluminum gallium arsenide barrier layer 13 comprises an undoped spacer subsidiary layer 13' (as indicated by the dashed line in FIG. 1) with a thickness of typically about 2 nm and a doped subsidiary layer 13" with a thickness of typically about 40 nm and doped with an impurity of one conductivity, n conductivity type in this example, to a dopant concentration of about $1.5 \times 10^{18}$ atoms $cm^{-3}$.

The use of such a so-called modulation doping technique spaces the dopant impurities away from the conduction channel and so reduces the risk of impurity related scattering which would otherwise reduce the conduction channel mobility. The spacer subsidiary layer 13' acts to space the dopant impurities even further from the conduction channel layer 11.

A capping layer 15 of gallium arsenide having a thickness of from about 10 to 30 nm and doped with an impurity of the one conductivity type, that is n conductivity in this example, to a dopant concentration similar to that of the barrier layer 13 is provided on the barrier layer 13.

The source and drain regions 20 and 21 are formed by local diffusion of dopants of the one conductivity type, in this example n conductivity type, into the ends of the channel-defining region 10, from the surface so as to extend into the gallium arsenide channel layer 11. The dopants may be introduced from a suitably doped metal alloy, for example an alloy of gold with an appropriate dopant, provided on the surface. So that the source and drain electrodes 22 and 23 provide good ohmic contact, further gold may be deposited onto that used to dope the source and drain regions 20 and 21. A suitable alloy such as a eutectic AuGe alloy containing 5 per cent by weight of nickel may be used.

The gate electrode 25 is provided between the source and drain regions 20 and 21, for example in a recess as illustrated in FIG. 1, in order to obtain better control of the conduction channel by field effect action. The gate electrode 25 may form a Schottky junction with the barrier layer 13 or may be provided on a dielectric layer to form an insulated gate structure. Where the gate electrode 25 forms a Schottky junction with the barrier layer 13, then the gate may be formed of, for example platinum, tantalum, paladium, molybdenum, titanium or aluminum.

In operation of the high electron mobility transistor (HEMT) shown in FIG. 1, when an appropriate voltage is applied to the gate electrode 25 via the contact G and an appropriate voltage is applied between the source and drain regions 20 and 21 a current flows between the source and drain electrodes 22 and 23 via the two-dimensional electron gas conduction channel 14 defined within the channel layer 11 adjacent the heterojunction 12. When a high lateral electric field of, typically, $3\times 10^5$ Vm$^{-1}$ (volts per meter) exists in the channel-defining region 10, hot electrons tend to be emitted from the channel-defining region 10 towards the substrate 2. However in the device shown in FIG. 1, the hot electrons are trapped in the potential well defined by the layer 31 where the electrons thermalize or come into thermal equilibrium with the lattice. Accordingly the hot electrons are constrained in the potential well defined by the layer 31 and are close to the gate electrode 25, enabling a higher output impedance to be achieved than could be achieved with a similar device not having the potential well region 30.

Although in the example shown in FIG. 1, the potential well region 30 comprises only a single potential well 31, this need not necessarily be the case. Rather, the potential well region 30 may comprise two or more potential wells 31 which may or may not be sufficiently separated by the barrier layers 33 so as not to be significantly electronically coupled.

Where two or more potential wells 31 are electronically coupled then an electron may 'see' the structure as effectively a single superlattice potential well. In such a case the width of the single superlattice potential well should be small compared to Lg/3 where Lg is the length of the gate.

In addition, in order to assist the trapping of hot electrons, the heterojunction interfaces between a potential well 31 and its barrier layers 33 may not be sharp interfaces but may rather be graded (by, for example varying x where the barrier layers are formed of Al$_x$Ga$_{1-x}$As) so as to define a subsidiary shallow potential well surrounding the potential well 31 for initially trapping electrons in a manner similar to that used in graded refractive index separate confinement heterostructures (GRINSCH) for lasers and other optical devices. Such a shallow subsidiary potential well provides a potential dish or basin around the potential well into which electrons initially fall and in which the electrons can thus be confined prior to capture by the potential well 31.

Such a grading of the heterojunction interfaces would however necessarily increase the separation of the potential well from the gate electrode 25 and in practice increasing the number of potential well defining layers 31 should sufficient increase the probability of capture of hot electrons emitted by the channel-defining region 10 so as to avoid the need for such graded interface regions.

Again, although the conduction channel 14 of the conduction channel-defining region 10 is shown in FIG. 1 as being formed by a two-dimensional electron gas provided adjacent a heterojunction, the conduction channel may be provided by a potential well, generally a quantum well, in which the two dimensional electron gas is confined between two heterojunctions defined by respective barrier layers. The increased confinement thus provided enables HEMTs of reduced output conductance to be manufactured.

In addition, the conduction channel-defining region 10 may comprise a number of parallel potential well conduction channels 14, thereby increasing the current handling capability. These conduction channel potential wells may be electronically decoupled or the barrier layers 13 may be sufficiently thin to enable electronic coupling of the conduction channel potential wells to form a superlattice structure.

The conduction channel-defining region 10 could have a structure similar to that described in EP-A-243953 in which the channel-defining region 10 is constructed of alternate barrier and potential well-defining layers 11 and 13' and the materials used for the layers 11 and 13' are selected such that electron mobility in the one material (normally the barrier defining material) is lower than the electric mobility in the other material under low applied electric fields but is higher under high electric fields so that conduction occurs preferentially in the channel layers defined by the other material under low applied electric fields and in the barrier layers defined by the one material under high applied electric fields. With such a structure the dependency of electron mobility on applied electric field may be reduced.

FIG. 3 is a cross-sectional view, part broken-away, of a second embodiment of a high electron mobility transistor in accordance with the invention which differs from that illustrated in FIG. 1 in respect of the structure of the potential well region 30a and the channel-defining region 10a. In other respects, the HEMT shown in FIG. 3 is similar to that shown in FIG. 1.

In the device shown in FIG. 3, the potential well-defining region 30a comprises a number of potential well-defining layers 31a bounded by barrier layers 33a forming respective heterojunctions 32a with the potential well-defining layer 31a. As shown in FIG. 3, there are two potential well-defining layers 31a. However, there may be three, four or more potential well-defining layers 31a. Preferably, the construction of the potential well-defining region 30a is such that the adjacent potential wells are not electronically coupled. As in the case of the example shown in FIG. 1, the potential well-defining layers 31a may be formed of undoped gallium arsenide while the barrier layers 33a may be formed of undoped aluminum gallium arsenide (preferably Al$_{0.25}$Ga$_{0.75}$As) or superlattice of aluminum arsenide and gallium arsenide having an equivalent average composition. The provision of a number of potential well-defining layers 31a should increase the probability of capture by the potential well-defining regions 30a of hot electrons emitted from the channel-defining region 10a.

In the example shown in FIG. 3, the conduction channel-defining region 10a similarly has a number of channel layers 11a bounded by barrier layers 13a which define heterojunctions 12a with the channel layers 11a so as to define a potential well, generally a quantum well, at each channel layer 11a. Again, the channel layers 11a may be formed of gallium arsenide while the barrier layers 13a may be formed of aluminum gallium arsenide or equivalent composition superlattices of aluminum arsenide and gallium arsenide.

As in the example described above, the channel layers 11a may be undoped and the free electrons provided within the channel layers 11a by so-called modulation doping from the barrier layers 13a which are doped with impurities of the one conductivity type. Again, although not shown in FIG. 3, the barrier layers 13a may have undoped spacer subsidiary layers further separating the dopant impurity atoms from the channel layers 11a.

The provision of a number of channel layers 11a should increase the current handling capability of the device. The conduction channel-defining region 10a may be constructed so that the channel layers 11a are not electronically coupled and so may form a multiple quantum well structure or may be such that the channel layers 11a are electronically coupled, thereby defining a superlattice structure.

FIG. 4 illustrates a possible modification of the channel-defining region 10a. As mentioned above, the channel layers 11a may be modulation doped by the barrier layers 13a. Where there are a number of channel layers 11a placed one on top of another then generally this will mean that modulation doping occurs via both heterojunctions 12a bounding a channel layer 11a. In the layer-by-layer growth technique such as molecular beam epitaxy or metal organic vapor phase epitaxy used to form such conduction channel regions, the heterojunction 12"a formed between the channel layer 11a and the overlying barrier layer 13a tends to be relatively smooth (hereinafter referred to as the normal interface) whereas, especially in the case where the barrier layers are formed of aluminum gallium arsenide and the conduction layers of gallium arsenide, the heterojunction 12'a where the channel layer 11a is formed on the barrier layer 13a tends to provide a relatively rough interface (hereinafter referred to as the inverted interface).

Although modulation doping from the first and second interfaces of each conduction channel layer roughly doubles the carrier concentration, the additional scattering caused by the relatively rough inverted interface may significantly reduce mobility below that attainable by carriers located only at the normal interface, particularly at low temperature. The causes of this significant reduction in mobility are not completely understood but it may result from increased inter-sub-band scattering, dopant segregation towards the inverted interface or skewing of the charge carrier distribution towards the poorer inverted interface at which there is scattering due to the interface roughness.

In the modified conduction channel region 10'a shown in FIG. 4, the barrier layers 13'a between adjacent channel layers 11'a each have a first subsidiary layer 130a doped with impurities of the one conductivity type for modulation doping the underlying channel layer 11'a via the normal or second interface 12"a and a second subsidiary layer 131a doped with impurities characteristic of the opposite conductivity type and sufficiently thin and lightly doped as to be fully depleted of free charge carriers at zero bias adjacent the inverted or first interface 12'a for inhibiting the provision of free charge carriers of the one conductivity type in a channel layer 11'a at the inverted interface 12'a.

As is commonly understood in the semiconductor art, a semiconductor region is said to be substantially, i.e. fully, depleted of free charge carriers of both conductivity types when the number of mobile or free charge carriers of both conductivity types is negligible (usually for example at least two orders of magnitude less) compared with that of the net impurity concentration in the region.

The second subsidiary barrier layers 13'a act to raise the conduction band of the channel layers 11'a adjacent the first or inverted interfaces or heterojunctions 12'a so that the Fermi level lies below the conduction band adjacent the inverted interfaces 12'a. Thus, the doped second subsidiary barrier layers 13'a act to prevent charge carriers of the one conductivity type being present adjacent the inverted interfaces 12'a in the potential wells formed by the channel layers 11'a.

The first subsidiary layer 130a is generally spaced from the underlying channel layer 11'a by an undoped spacer layer 132a. A similar undoped spacer layer 133a may, although not necessary, be provided between the second subsidiary layer 131a and the overlying channel layer 11a. Of course, the barrier layer 13'a defining the normal interface 12'a with the uppermost channel layer 11a and the barrier layers 13'a defining the inverted interface 12'a with the lowermost channel layer 11a will be provided only with a first and second subsidiary layer 130a and 131a, respectively.

It will of course be appreciated that the free charge carriers for the conduction channel-defining region 10, 10a could be provided by direct doping of the channel layer(s) 11, although at the expense of increased scattering at the sites of the donor atoms and thus reduced mobility. In addition, a semiconductor device in accordance with the invention may have the conduction channel defining region 10 of FIG. 1 in combination with the potential well-defining region 30 of FIG. 4 or vice versa.

Although specific examples have been described above, other materials could be used. Thus, for example the gallium arsenide could be replaced by gallium indium arsenide and the aluminum gallium arsenide by aluminum indium arsenide in which case the substrate may be formed of indium phosphide.

Different materials could of course be used for forming the channel layers 11a and the potential well defining layers 31a. Similarly, different materials may be used for defining the barrier layers 13a and 33a.

The present invention may be applied to other field effect devices in addition to HEMTs and may be applied to devices where materials other than III-V compound semiconductors are used, for example to devices using silicon and silicon-germanium alloys or possibly II-VI compounds. Also, the present invention may be applicable to devices where the majority charge carriers are holes rather than electrons, in which case the conductivity types given above would be reversed.

From reading the present disclosure, other modifications and variations will be apparent to persons skilled in the art. Such modifications and variations may involve other features which are already known in the semiconductor art and which may be used instead of or in addition to features already described herein.

I claim:

1. A semiconductor device comprising a semiconductor body having a substrate on which is provided a channel-defining region extending between input and output regions, the channel-defining region comprising a channel layer forming a heterojunction with at least one barrier layer so as to form within the channel layer a two-dimensional free charge carrier gas of one conductivity type for providing between the input and output regions a conduction channel controllable by a gate electrode overlying the channel-defining region, characterized in that a potential well region is provided between the substrate and the channel-defining region which comprises at least one potential well-defining layer forming heterjunctions with adjacent barrier layers to define for charge carriers of the one conductivity type a single potential well which is empty of free charge carriers of the one conductivity type when no voltage is applied between the input and output regions and which is sufficiently deep and wide to trap hot charge carriers of the one conductivity type emitted from the channel-defining region towards the substrate.

2. A semiconductor device according to claim 1, further characterized in that the potential well has a depth in energy of approximately 0.2 eV (electron volts), a width of approximately 30 nm (nanometers) and is spaced from the at least one channel layer of the channel-defining region by approximately 50 nm.

3. A semiconductor device accordingly to claim 1, further characterized in that the channel layer is bounded on either side by heterojunction-defining barrier layers thereby forming a potential well for charge carriers of the one conductivity type.

4. A semiconductor device according to claim 1, further characterized in that the channel-defining region comprises a number of channel layers each forming a heterojunction with adjacent barrier layers so as to form a number of potential wells for charge carriers of the one conductivity type.

5. A semiconductor device according to claim 4, further characterized in that each channel layer forms a potential well for charge carriers of the one conductivity type by defining a first heterojunction with the barrier layer on which the channel layer is formed and a second heterojunction with the barrier layer formed on the channel layer, and in that a first subsidiary barrier layer doped with impurities characteristic of the one conductivity type is provided adjacent each second heterojunction for providing free charge carriers of the one conductivity type in the channel layers at the second heterojunctions and a second subsidiary barrier layer doped with impurities characteristic of the opposite conductivity type and sufficiently thin and lightly doped as to be fully depleted of free charge carriers at zero bias is provided between channel layers adjacent the first heterojunction for inhibiting the provision of free charge carriers of the one conductivity type in a channel layer at the first heterojunction.

6. A semiconductor device according to claim 5, further characterized in that each first subsidiary barrier layer is spaced from the associated second heterojunction by an undoped spacer subsidiary layer of the barrier layer.

7. A semiconductor device accordingly to claim 4, further characterized in that the barrier layers of the channel-defining region are sufficiently thin that the potential wells are electronically coupled to form a superlattice region.

8. A semiconductor device according to claim 1 further characterized in that the at least one barrier layer forming a heterojunction with the at least one channel layer is doped with impurities for providing the free charge carriers of the one conductivity type within the channel layer.

9. A semiconductor device according to claim 1, further characterized in that an undoped buffer layer is provided between the substrate and the potential well defining region.

10. A semiconductor device according to claim 1, further characterized in that the barrier layers of the potential well-defining region are graded so as to produce graded heterojunction interfaces thereby defining a shallow subsidiary potential well surrounding the potential well of the potential well-defining region.

11. A semiconductor device comprising a semiconductor body having a substrate on which is provided a channel-defining region extending between input and output regions the channel-defining region comprising a channel layer forming a heterojunction with at least one barrier layer so as to form within the channel layer a two-dimensional free charge carrier gas of one conductivity type for providing between the input and output regions a conduction channel controllable by a gate electrode overlying the channel-defining region, characterized in that a potential well region is provided between the substrate and the channel-defining region which comprises a number of potential well-defining layers forming heterojunctions with adjacent barrier layers to define for charge carriers of the one conductivity type a number of potential wells with the barrier layer between adjacent potential wells being sufficiently wide such that adjacent potential wells are electronically decoupled and with each potential well being empty of free charge carriers of the one conductivity type when no voltage is applied between the input and output regions and sufficiently deep and wide to trap hot charge carriers of the one conductivity type emitted from the channel-defining region towards the substrate.

* * * * *